US006941235B2

(12) United States Patent
Gattiker

(10) Patent No.: US 6,941,235 B2
(45) Date of Patent: Sep. 6, 2005

(54) METHOD AND SYSTEM FOR ANALYZING QUIESCENT POWER PLANE CURRENT (IDDQ) TEST DATA IN VERY-LARGE SCALE INTEGRATED (VLSI) CIRCUITS

(75) Inventor: Anne Elizabeth Gattiker, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 10/695,554

(22) Filed: Oct. 28, 2003

(65) Prior Publication Data

US 2005/0090996 A1 Apr. 28, 2005

(51) Int. Cl.$^7$ .............................................. G01R 19/00
(52) U.S. Cl. ......................................................... 702/64
(58) Field of Search ................................ 324/713, 763, 324/765; 702/64; 714/724, 736

(56) References Cited

U.S. PATENT DOCUMENTS

| | | | |
|---|---|---|---|
| 6,175,244 B1 | 1/2001 | Gattiker et al. | |
| 6,366,108 B2 | 4/2002 | Maxwell et al. | |
| 2002/0060584 A1 * | 5/2002 | Okuda | 324/765 |
| 2004/0006731 A1 * | 1/2004 | Manhaeve et al. | 714/736 |
| 2004/0046576 A1 * | 3/2004 | Manhaeve et al. | 324/713 |

OTHER PUBLICATIONS

Kruseman, et al. The Future of IDDQ Testing, IEEE International Test Conference Proceedings, 2001.
Thibeault, Improving Delta–IDDQ–based Test Methods, IEEE International Test Conference Proceedings, 2000.
Maxwell,, et al. Current Ratios: A Self–Scaling Technique, IEEE International Test Conference Proceedings, 1999.
Gattiker,, et al. Current Signatures, IEEE VLSI Test Symposium Proceedings, 1996.

(Continued)

Primary Examiner—John Barlow
Assistant Examiner—Cindy D. Khuu
(74) Attorney, Agent, or Firm—Weiss, Moy & Harris, P.C.; Andrew M. Harris; Casimer K. Salys

(57) ABSTRACT

A method and system for analyzing quiescent power plane current test data in a very large scale integrated (VLSI) circuit provides diagnostic information and improved IDDQ testing for analyzing and detecting manufacturing defects in a VLSI device. A set of IDDQ test values is collected over a set of test vectors for a group of devices. Values that are detected as corresponding to activated defects (e.g., shorts) are discarded from the data set and the data set is checked for correlation between the remaining ostensibly defect-free data values and devices (or alternatively vectors) that do not correlate are discarded from the data set. Then, a regression is generated for each vector from and IDDQ values for each vector and the IDDQ values at a selected reference vector (excepting the reference vector). Next, the IDDQ values at each vector for each device are normalized by estimating an expected IDDQ value for that vector and device from the regression for the vector and the device's measured reference vector IDDQ value. A cross-correlation check is performed to determine whether the set of measurements represents a good set of ostensibly defect-free measurements. New values that are detected as corresponding to an activated defect are discarded and previously discarded values are potentially reclaimed. The above regression, normalization and discard procedure is repeated until the set of non-defect activated vectors is stable and the IDDQ measurements can be categorized into discrete categories. The categorized IDDQ values may be used for identifying and potentially diagnosing defective devices and/or acceptability of devices can be determined from the normalized IDDQ values.

20 Claims, 4 Drawing Sheets

OTHER PUBLICATIONS

Okuda, Eigen–Signatures for Regularity–based IDDQ Testing, IEEE VLSI Test Symposium Proceedings, 2002.

Okuda, Decouple: Defect Current Detection in Deep Sub–micron IDDQ, IEEE International Test Conference Proceedings, 2000.

Variyam, Increasing the IDDQ Test Resolution Using Current Prediction, IEEE International Test Conference Proceedings, 2000.

Bergman, et al., Improved IDDQ Testing With Empirical Linear Prediction, IEEE International Test Conference Proceedings, 2002.

Henry, et al., Burn–in Elimination of a High Volume Microprocessor Using IDDQ, IEEE International Test Conference Proceedings, 1996.

Nigh, Application and Analysis of IDDQ Diagnostic Software, IEEE International Test Conference Proceedings, 1997.

Lavo, et al., Eliminating the Ouija Board: Automatic Thresholds and Probabilistic IDDQ Diagnosis, IEEE International Test Conference Proceedings, 1999.

Gattiker, Current Signatures for Integrated Circuit Test Strategy Advisor, Carnegie Mellon University, Ph.D. Dissertation.

* cited by examiner

METHOD AND SYSTEM FOR ANALYZING QUIESCENT POWER PLANE CURRENT (IDDQ) TEST DATA IN VERY-LARGE SCALE INTEGRATED (VLSI) CIRCUITS

BACKGROUND OF THE INVENTION

1. Field of the Invention

The present invention generally relates to integrated circuit test systems, and more particularly to a computer program that analyzes integrated circuit power supply pin quiescent current measurements.

2. Description of Related Art

Manufacturing tests and design verification tests are necessary for ensuring functionality and reliability of large-scale digital integrated circuits such as Very Large Scale Integration (VLSI) circuits. Millions of transistors and logic gates are often combined on a single die and the performance of the die is verified both in the design phase and the manufacturing phase of a VLSI product cycle.

Power supply current for individual gates or blocks within such a VLSI circuit combines to generate the power requirements for the overall die, and will typically combine in sub-groups to several power and ground pins that are typically also connected within the integrated circuit package. Faults within a VLSI circuit are generally caused by short circuit paths or open circuit paths in conductor or semiconductor segments and as device and line size is decreased in order to increase transistor count, a tolerable defect level is established by a manufacturer. Post-manufacture testing is performed, generally at the wafer level, in order to avoid packaging defective devices.

One test that has proven very efficient for determining whether short circuit faults exist in semiconductor dies is a quiescent supply current test (or IDDQ test). IDDQ testing is typically performed by measuring the leakage current through the power supply plane (sum of the power pin or return pin currents, i.e., IDDQ) using a manufacturing tester parametric (analog) measurement capability. A series of test vectors are used to exercise internal states of the integrated circuit and the IDDQ measurements are used to discover states in which an internal short is activated (for example, a short to ground on the output of an inverter raises IDDQ when the input of the inverter is set to a known low state by the test vector pattern).

However, typical logic gate signal transistors within present-day VLSI circuits have relatively high impedance, therefore the IDDQ rise caused by a short circuit may be slight, as a "perfect" IDDQ for the entire die may be very high for devices including millions of transistors and the additional contribution from a single short may be masked by measurement noise or die-to-die variations in IDDQ. The effect of a short on IDDQ may be different depending on the internal logic states set at particular vector. Additionally, the "background" IDDQ typically varies significantly as a function of the internal state of the die, masking variations that are indicating activated defects. Further, even for failure-free devices IDDQ measurements vary significantly between each vector and defects such as wafer defects may cause only a partial short circuit that may affect performance or reliability of a die, while causing only a slight change in IDDQ.

Due to the differing influences of a short on IDDQ mentioned above, variations in IDDQ due to activated faults tend to fall into discrete categories, or levels of IDDQ separated by gaps, that provide further information about the location and/or nature of a fault. In addition, there is a category of IDDQ levels that correspond to an absence of activated faults. For diagnostic purposes, it would be useful to identify a category of a fault generated by a short for a particular vector, via an IDDQ measurement. For diagnostic purposes, it would be useful to study the behavior of IDDQ over a large range of test vectors. However, in production testing, the number of IDDQ test vectors for which IDDQ measurements are collected is generally very limited, as IDDQ measurement is a time-consuming process. Further, the devices available for diagnostic analysis may only consist of defective devices, as yield may be low during a "bring-up" phase or because diagnostic data collection resources are reserved for use only on defective devices.

Techniques exist that establish per-vector thresholds for IDDQ measurements to attempt to compensate for the variations due to internal differences in states. However, such techniques typically do not condition data for diagnostic use that takes advantage of relationships between a defect, the internal state of the die as set at a particular vector and the IDDQ level of the die at the particular vector. In particular, the above-mentioned techniques typically do not assist in categorizing a fault/vector relationship for diagnostic purposes. Moreover, prior techniques typically rely on baseline data that is based on inclusion of a significant number of "good" devices in the sample.

Therefore, it would be desirable to implement an improved IDDQ testing algorithm that provides diagnostic information as well as improved pass/fail test information. It would further be desirable to provide an algorithm that takes advantage of relationships between a defect and the internal state of the die at each vector.

SUMMARY OF THE INVENTION

The objective of providing an improved IDDQ testing algorithm that takes advantage of vector-dependent relationships between IDDQ levels is achieved in a method for classifying quiescent power plane current in a VLSI circuit. The method reads or collects a data set of quiescent power plane current values over multiple test vectors for a group of VLSI devices. The group of VLSI devices may be a group of defective devices displaying unacceptable IDDQ levels for at least one, or possibly all test vectors. The method may then determine whether or not the values in each set likely correspond to defects activated by the associated test vector and discard values determined to correspond to activated defects to yield a modified data set. Next, data may be removed from the data set by checking the correlation of IDDQ current at each remaining vector (i.e., those vectors that are currently determined to not activate a defect) from device to device.

Then, vector-to-vector current differences are characterized over the entire group of semiconductor dies in conformity with the modified data set by producing a regression for each vector with respect to a selected reference vector or set of reference vectors. Finally, the method normalizes the set of current values for each die in conformity with the estimated value obtained from the reference vector value(s) for the die and the regressions for each other vector.

The process can be iterated by discarding data points that are newly discovered as corresponding to activated defects after the previous iteration (and potentially retrieving previously discarded values) and repeating regression and normalization calculations until the set of normalized values is stable. (Retrieval of discarded values is particularly desirable when using the method of the present invention on small sample sizes.) The data sets can then be re-evaluated to locate and/or reject defective dies or to diagnose faults within defective dies.

The invention may be further embodied in a manufacturing tester or general-purpose computer executing program instructions for carrying out the steps of the method, and in a computer program product having a storage media for encoding the program instructions.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
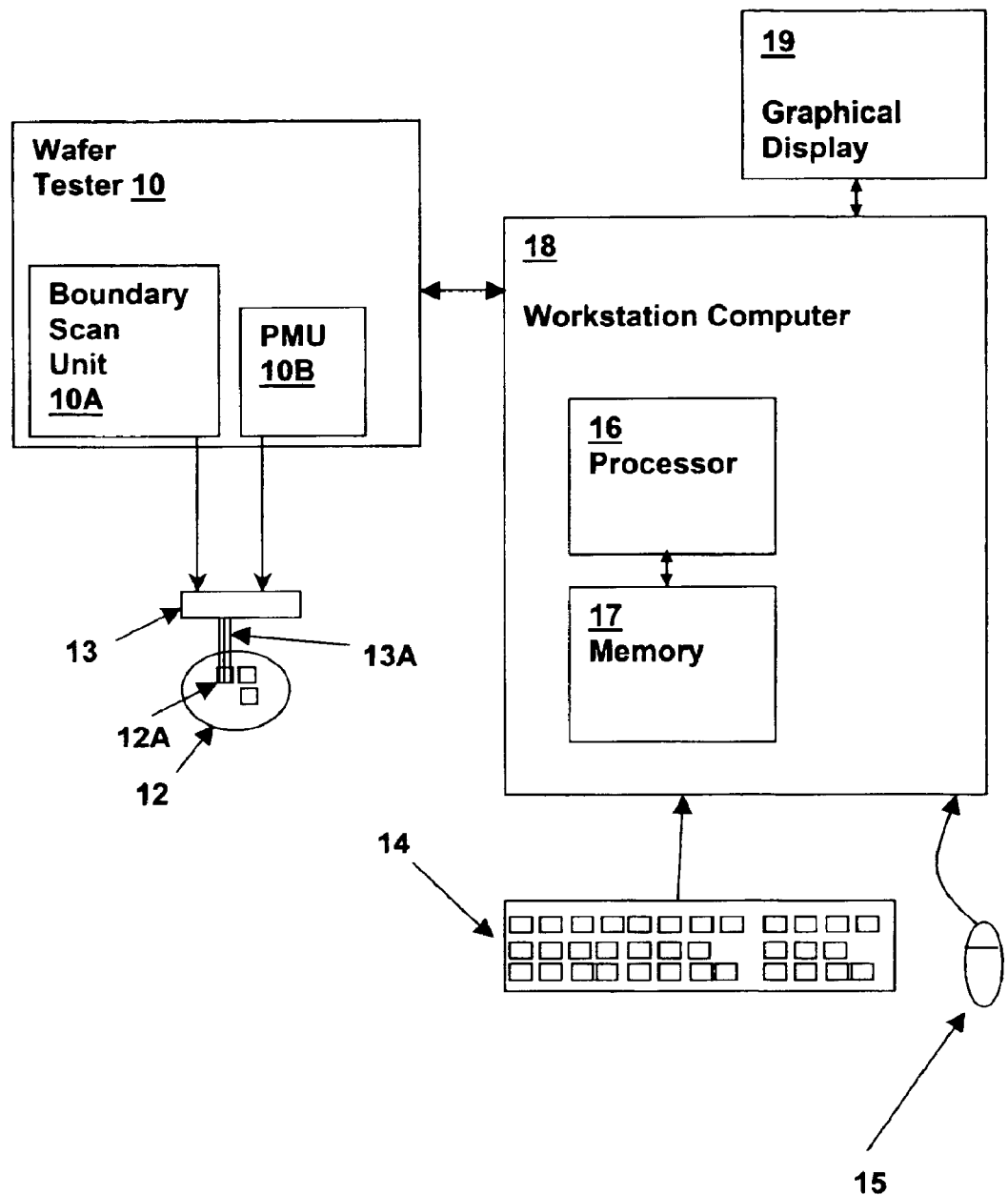
FIG. 1 is a pictorial diagram of a manufacturing tester connected to a device under test by methods in accordance with an embodiment of the present invention.

Referring to the figures, and particularly to FIG. 1, a VLSI wafer test system, in which methods according to an embodiment of the present invention are performed, is depicted. A wafer tester 10 includes a boundary scan unit 10A for providing stimulus to a die 12A on a wafer under test 12, via a probe head 13 having electrical test connections 13A to die 12A. Wafer tester 10 also includes a parametric measurement unit (PMU) 10B, also coupled to die 12A via probe head 13 via electrical test connections 13A that can measure analog parameters such as the power plane current (IDDQ) as measured in accordance with the methods of the present invention. IDDQ measurements are performed over a series of test vectors stimulated by boundary scan unit 10A and after a delay for permitting the current to settle to a quiescent state, PMU 10B provides a measurement of IDDQ for each vector.

A workstation computer 18, having a processor 16 coupled to a memory 17, for executing program instructions from memory 17, wherein the program instructions include program instructions for executing one or more methods in accordance with an embodiment of the present invention, is coupled to wafer tester 10, whereby IDDQ measurement for a plurality of dies over a plurality of test vectors are collected and stored in memory 17 and/or other media storage such as a hard disk. Workstation computer 18 is also coupled to a graphical display 19 for displaying program output such as the normalized current graphs provided by embodiments of the present invention. Workstation computer 18 is further coupled to input devices such as a mouse 15 and a keyboard 14 for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 18. Further, workstation computer 18 may be coupled to wafer tester by such a network connection.

While the system of FIG. 1, depicts a configuration suitable for sequential test of a plurality of dies on a wafer, the depicted system is illustrative and not limiting to the present invention. Probe head 13 may be a multi-die full wafer probe system, or may comprise multiple probe heads for simultaneously testing multiple wafers on a single or multiple die basis. Additionally, while boundary scan vector injection is illustrated, the techniques of the present invention may also be applied to test patterns generated internally by die 12A including the execution of test code from a processor incorporated on die 12A, or test patterns generated by connection of die 12A to a stimulus source other than boundary scan unit 10A, for example, a dedicated exerciser logic.

Figure 2:
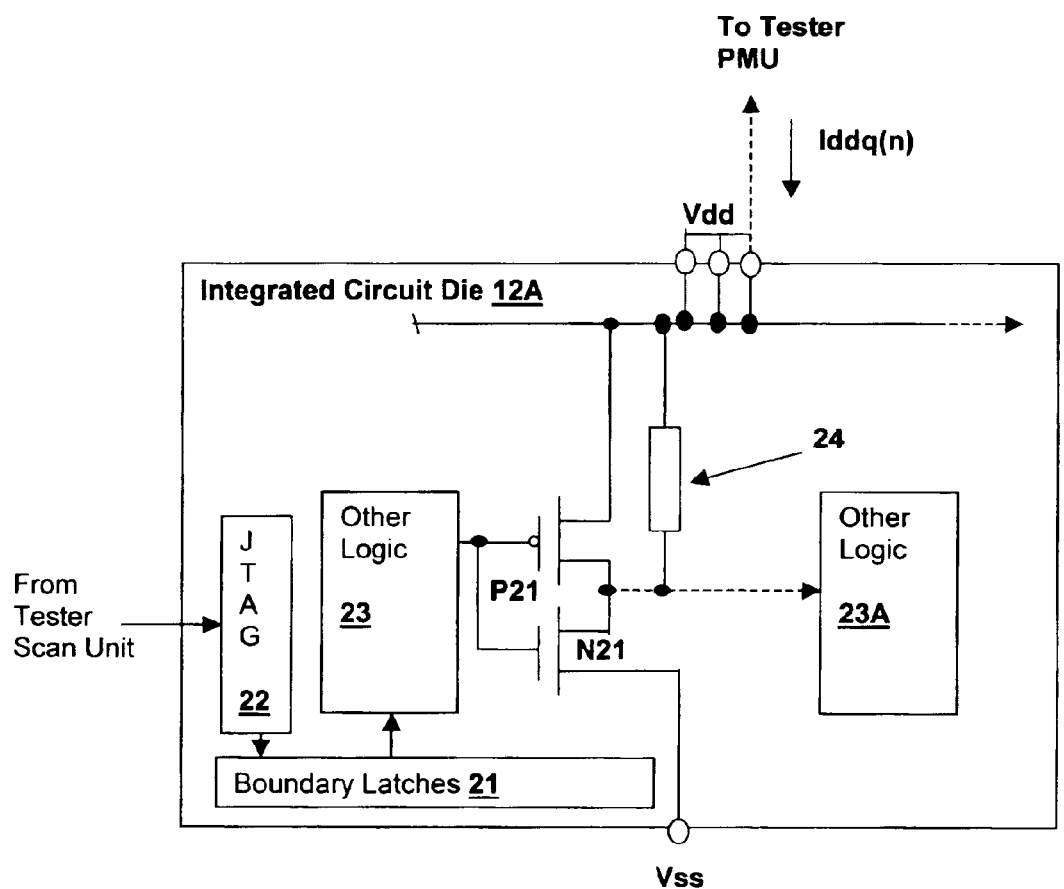
FIG. 2 is a schematic diagram depicting details of the device under test of FIG. 1.

Referring now to FIG. 2, a block diagram of a simplified integrated circuit die 12A for illustrating the methods of the present invention is shown. The power supply current $I_{ddq}(n)$ for the combined power plane of die 12A is measured as die 12A is stimulated from Joint Test Action Group (JTAG) interface 22, which sets boundary latches 21 that set internal states of integrated circuit die 12A. Other logic 23 may be present between boundary latches 21 and logic that activates a defect 24, depicted as a shorting impedance 24 between the power supply rail and a logical CMOS inverter formed by transistors P21 and N21. When the gates of transistors N21 and P21 are inactive (low), impedance 24 will not cause a significant rise in IDDQ. However, when the gates of transistors N21 and P21 are active (high), impedance 24 will cause a rise in IDDQ by conducting current from the power supply rail to ground through transistor N21. The above-described circuit is illustrative of a defect (short) that is activated by all states in which the input of the inverter is active (i.e., the gates of transistors N21 and P21 are the logical high voltage state). More complex faults are also detectable via IDDQ rise, such as shorts between logical circuit nodes that become active when the nodes are in different states and semi-conducting shorts that are active only for particular states and polarity. Shorting impedance 24 affects the delay and/or logic level of signals transmitted by the inverter formed by transistors P21 and N21 to other logic circuits 23A.

In general, the various types and numbers of defects that may be present, the various device sizes (corresponding to differing device impedances) that are present in a VLSI device, the various states of all of the logic gates across different test vectors and the variations from device to device yield IDDQ measurements that do not clearly distinguish between defect-free vector measurements and measurements that correspond to vectors having one or more activated defects. The present invention addresses the above-described problem by post-processing collected data from a group of dies in order to distinguish defect-free measurements from measurements that correspond to an activated defect. Alternatively, the present invention may post-process collected data from a group of dies in order to distinguish measurements that correspond to activated defects of differing categories by more clearly separating the measured IDDQs into discrete levels.

Figure 3:
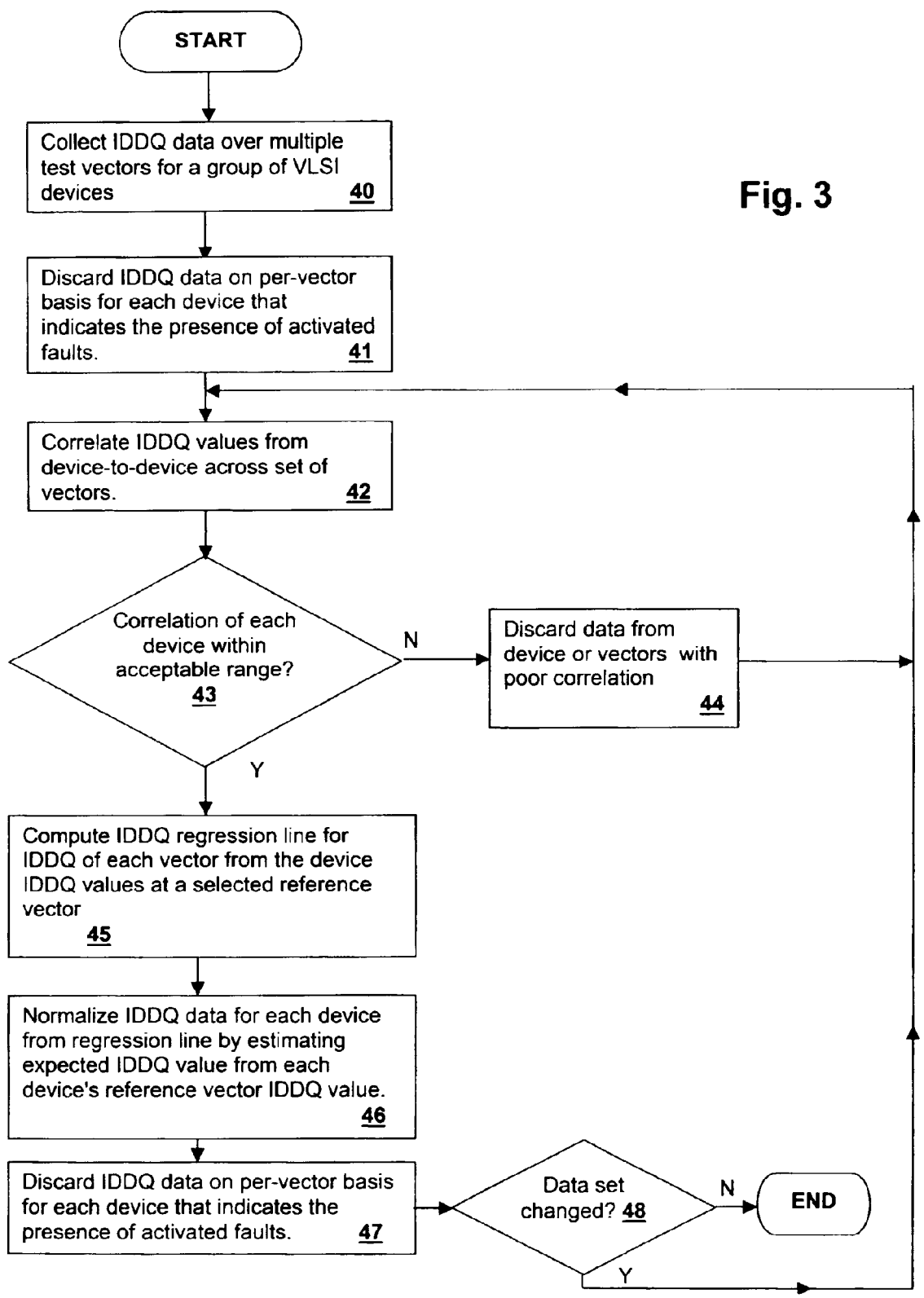
FIG. 3 is a flow chart depicting a method in accordance with an embodiment of the present invention.

Referring now to FIG. 3, a method in accordance with an embodiment of the present invention is depicted in a flowchart. First, IDDQ measurement data for a sequence of test vectors is collected for a group of VLSI devices (step 40).

Next, the IDDQ measurements are evaluated for each device on a per-vector basis and data indicating the presence of activated faults is discarded (step 41). The evaluation may be performed, for example, by identifying sets of values separated by a threshold range or "gap" and discarding values that do not fall within the lowest set of measurements (the ostensibly non-defect-activating measurements). Then, a cross-correlation of remaining per-vector IDDQ values from device-to-device is made and data for which the correlation is not within an acceptable range (decision 43) (e.g., data for which the minimum or mean correlation of all of the data for a given device is below a threshold) is removed from the data set (step 44). IDDQ regression curves (generally lines) are then calculated for each vector from the device data for that vector (step 45). The regressions are computed on each device's IDDQ value for the vector versus the IDDQ value for that device at a selected reference vector. (A regression is not generated for the reference vector, as there would be perfect correlation among the values.) Optionally, if any vector has too few ostensibly defect-free IDDQ values in the data set to perform a meaningful regression, a default value such as the mean slope and intercept value as determined over the set of remaining vectors can be substituted for at least one iteration of the process, but if the vector continues to show too few defect-free IDDQ values, it is then removed from the data sets.

Next, the IDDQ data for each device at each vector is normalized using the regression line by estimating an expected value of IDDQ for that vector and device using the device's reference vector IDDQ and the regression for the instant vector and subtracting the expected value from the measured value (step 46). IDDQ data is then discarded (on a per-vector basis) for each device that indicates the presence of activated faults in the normalized data (step 47), which may once again be by an evaluation of the above-described "gap" evaluation of step 41. If the data set has changed (decision 48)—i.e., the set of values identified as not activating a defect is different than the set at the previous entry to step 42, then the process is repeated from step 42 until the data set does not change or another condition is detected such as the data set becoming too sparse indicating non-convergence.

Optionally, multiple reference vectors may be used in the above-described method by selecting a set of initial reference vectors, which could be all of the vectors. Regressions are computed to calculate a slope and intercept for each vector with respect to each reference vector. A normalized current for each measurement is calculated from the expected current values computed by averaging the expected values computed using each reference vector in the set identified as not activating a defect for the data set. The reference vector set can be chosen such that all devices have at least one reference vector among the set of vectors that is categorized as not activating a defect, unless the set is empty. If the set is empty, an alternative technique such as using the reference vector that produces the lowest IDDQ may be used. However, use of multiple reference vectors increases the likelihood that at least one reference vector is available as the basis for calculating the normalized current for each data set, which in turn reduces the error that would arise from calculating the normalized current based on a measurement that activates a defect. Alternatively, a multidimensional regression technique may be employed.

The reference vector(s) may also be changed during the single or multiple reference vector-based iterative process described above. For example, new reference vector(s) may be chosen at each iteration as the vector(s) having corresponding IDDQ values occurring most frequently in the IDDQ category corresponding to no activated defect across the data sets after discarding (and/or retrieving) data values or sets.

It should be noted that the method described above can be performed on lots of devices that all contain defects, and a full or nearly full set of regression estimators can be produced. Generally, it is desirable to provide that all of the devices in a lot do not activate defects on at least one of the vectors, so that that vector may be used as a reference. Further, the method may be modified to include the use of multiple reference vectors as described above. However, the techniques of the present invention may be used to categorize defects without having a single non-defect activating vector that is common among all devices. Thus, the method of the present invention is particularly useful in determining normal quiescent current variations within prototype and manufacturing set-up/restart runs where yield is low. The method has been proven effective on groups of devices as low as 50.

A primary advantage of and distinction of the present invention from the prior art is that the method of the present invention provides normalized data that permits categorization of IDDQ levels into different defect-activating categories and a non-defect-activating category. However, for a given device or group of devices, one or more categories may be absent. The methods of the present invention are useable on measurements for which "good chip" baselines have not been established or for which no "good chip" data is available, where prior techniques typically require a baseline data set that is based on including at least a significant number of "good" parts in the sample.

Further the reference measurement used in the methods of the present invention may be selected as a vector for which there is no active defect in any device, but the methods will also work without having a defect-free reference vector common to all devices in the sample. Since the background IDDQ is a normal leakage current for a particular state of the device, it is apparent that variations in such characteristics as number of N-channel devices leaking vs. number of P-channel devices leaking will cause variations in normal IDDQ values from vector to vector that are accounted for in the normalization techniques of the present invention by providing a differing vector-to-vector background current value for each device.

Figure 4A:
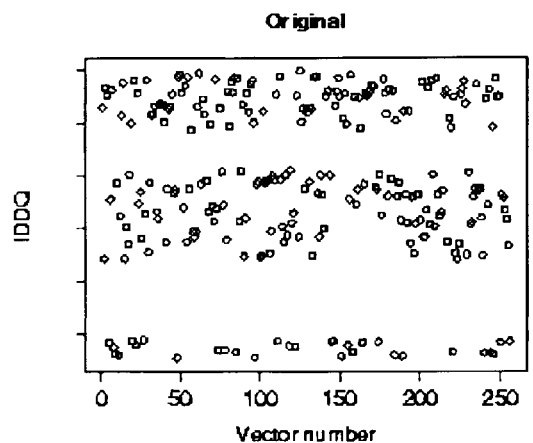
FIGS. 4A and 4B are graphs depicting raw input data and normalized results, respectively, of a method in accordance with an embodiment of the present invention.
Figure 4B:
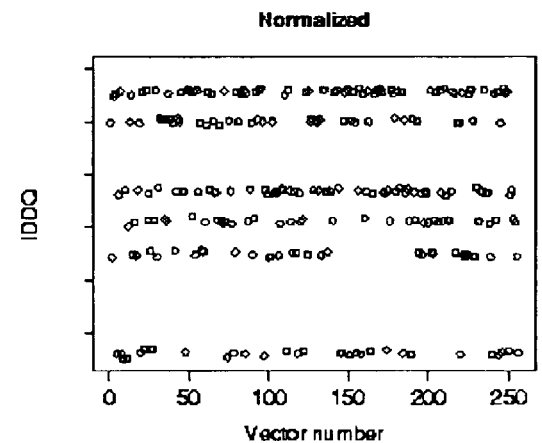
Figure 4C:
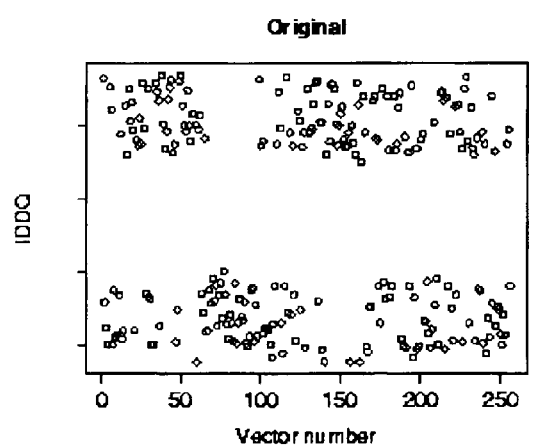
FIGS. 4C and 4D are graphs depicting another set of raw input data and normalized results, respectively, of a method in accordance with an embodiment of the present invention.
Figure 4D:
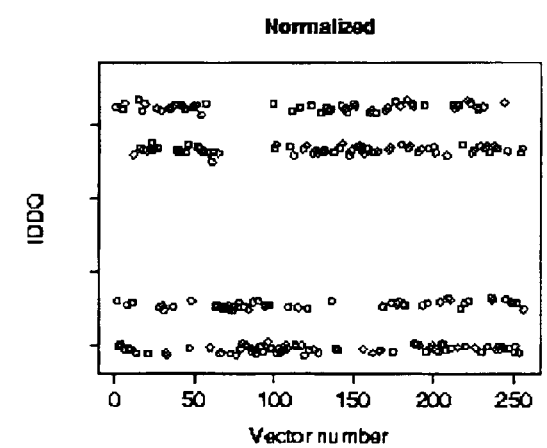

Referring now to FIGS. 4A–4D, graphs illustrating the advantages of the present invention are depicted. FIG. 4A depicts IDDQ test data for a particular device prior to normalization. As can be seen from the graph, the IDDQ values are grouped in three bands, but the data varies widely within those bands. FIG. 4B depicts normalized IDDQ data for the same device. The IDDQ values are now distinctly grouped in six bands, yielding more information about the categories of the activated defects, and grouping values due to defects more clearly away from normal values (corresponding to the lowest group of data) and making clearer the category to which each IDDQ values belongs. Generally the defect-free category is the lowest IDDQ level category, however, for some high-defect devices the lowest level category may be a defect category as well. FIG. 4C depicts IDDQ test data for a second device prior to normalization. As can be seen from the graph, the IDDQ values are roughly grouped in two bands. FIG. 4D depicts normalized IDDQ data for the second device. The IDDQ values are now distinctly grouped in four bands, yielding clearer information about the presence and categories of activated defects.

The data depicted in FIGS. 4B and 4D may then be used for diagnostic purposes in order to determine the location and/or nature of the defects, or may be used to implement a pass/fail test that is improved by the separation provided between a defect-free category (lowest IDDQ level) and defect-activating categories.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for analyzing power plane quiescent current measurements performed on a group of integrated circuits, comprising:

reading a plurality of data sets, each of said data sets containing a plurality of quiescent current values corresponding to a plurality of stimulus vectors of said measurements, where in each of said data sets contains data gathered on a corresponding one of said group of integrated circuits;

selecting one of said stimulus vectors as a reference vector;

computing an estimator of quiescent current for each remaining one of said stimulus vectors as a function of reference vector quiescent current level; and normalizing said quiescent current values in at least one of said data sets by calculating an expected quiescent current value for each of said remaining stimulus vectors and subtracting said expected quiescent current value for each of said remaining stimulus vectors from a corresponding one of said quiescent current values, whereby variations in said quiescent current measurements that are not due to activated defects are reduced and said quiescent current measurements are categorized in ranges of quiescent current levels.

2. The method of claim 1, further comprising discarding ones of said quiescent current values that are above a threshold prior to performing said computing and normalizing to select quiescent current values that are not indicative of activated defects.

3. The method of claim 2, further comprising:

cross-correlating remaining ones of said quiescent current values across said plurality of data sets, prior to performing said computing and said normalizing; and discarding quiescent current values for which a result of said cross-correlating is below a threshold.

4. The method of claim 3, wherein said discarding discards an entire one of said data sets in response to detecting that a correlation of said data set is below a threshold.

5. The method of claim 1, further comprising:

subsequent to said normalizing, determining whether or not any of said normalized quiescent current values indicate the presence of an activated defect; and responsive to determining that one of or more of said normalized quiescent current values indicates the presence of an activated defect, discarding quiescent current values corresponding to said one or more normalized quiescent current values.

6. The method of claim 5, further comprising repeating said computing and normalizing responsive to determining that one of or more of said normalized quiescent current values indicates the presence of an activated defect.

7. The method of claim 1, wherein each of said group of devices includes a defect that is activated by at least one of said stimulus vectors, whereby said method determines a set of regressions for normalizing quiescent current data without requiring a defect-free device.

8. A computer program product for use with a workstation computer, wherein said computer program product comprises signal bearing media containing program instructions for execution within said workstation computer for analyzing power plane quiescent current measurements performed on a group of integrated circuit, wherein said program instructions comprise program instructions for:

reading a plurality of data sets, each of said data sets containing a plurality of quiescent current values corresponding to a plurality of stimulus vectors of said measurements, where in each of said data sets contains data gathered on a corresponding one of said group of integrated circuits;

selecting one of said stimulus vectors as a reference vector;

computing an estimator of quiescent current for each remaining one of said stimulus vectors as a function of reference vector quiescent current level; and normalizing said quiescent current values in at least one of said data sets by calculating an expected quiescent current value for each of said remaining stimulus vectors and subtracting said expected quiescent current value for each of said remaining stimulus vectors from a corresponding one of said quiescent current values, whereby variations in said quiescent current measurements that are not due to activated defects are reduced and said quiescent current measurements are categorized in ranges of quiescent current levels.

9. The computer program product of claim 8, wherein said program instructions further comprise program instructions for discarding ones of said quiescent current values that are above a threshold prior to executing said program instructions for computing and normalizing to select quiescent current values that are not indicative of activated defects.

10. The computer program product of claim 9, wherein said program instructions further comprise program instructions for:

cross-correlating remaining ones of said quiescent current values across said plurality of data sets, said program instructions for cross-correlating executed prior to said program instructions for computing and normalizing; and discarding quiescent current values for which a result of said cross-correlating is below a threshold.

11. The computer program product of claim 10, wherein said program instructions for discarding discard an entire one of said data sets in response to detecting that a correlation of said data set is below a threshold.

12. The computer program product of claim 8, wherein said program instructions further comprise program instructions for:

subsequent to said normalizing, determining whether or not any of said normalized quiescent current values indicate the presence of an activated defect; and responsive to said program instructions for determining having determined that one of or more of said normalized quiescent current values indicates the presence of an activated defect, discarding quiescent current values corresponding to said one or more normalized quiescent current values.

13. The computer program product of claim 12, wherein said program instructions further comprise program instructions for repetitively executing said program instructions for computing and normalizing responsive to said program instructions for determining having determined that one of or more of said normalized quiescent current values indicates the presence of an activated defect.

14. A workstation comprising:
- a memory for storing program instructions and data values for analyzing power plane quiescent current measurements performed on a group of integrated circuits;
- a processor for executing said program instructions, wherein said program instructions comprise program instructions for
- reading a plurality of data sets, each of said data sets containing a plurality of quiescent current values corresponding to a plurality of stimulus vectors of said measurements, where in each of said data sets contains data gathered on a corresponding one of said group of integrated circuits,
- selecting one of said stimulus vectors as a reference vector,
- computing an estimator of quiescent current for each remaining one of said stimulus vectors as a function of reference vector quiescent current level, and
- normalizing said quiescent current values in at least one of said data sets by calculating an expected quiescent current value for each of said remaining stimulus vectors and subtracting said expected quiescent current value for each of said remaining stimulus vectors from a corresponding one of said quiescent current values, whereby variations in said quiescent current measurements that are not due to activated defects are reduced and said quiescent current measurements are categorized in ranges of quiescent current levels.

15. The workstation of claim 14, wherein said program instructions further comprise program instructions for discarding ones of said quiescent current values that are above a threshold prior to executing said program instructions for computing and normalizing to select quiescent current values that are not indicative of activated defects.

16. The workstation of claim 15, wherein said program instructions further comprise program instructions for:
- cross-correlating remaining ones of said quiescent current values across said plurality of data sets, said program instructions for cross-correlating executed prior to said program instructions for computing and normalizing; and
- discarding quiescent current values for which a result of said cross-correlating is below a threshold.

17. The workstation of claim 16, wherein said program instructions for discarding discard an entire one of said data sets in response to detecting that a correlation of said data set is below a threshold.

18. The workstation of claim 14, wherein said program instructions further comprise program instructions for:
- subsequent to said normalizing, determining whether or not any of said normalized quiescent current values indicate the presence of an activated defect; and
- responsive to said program instructions for determining having determined that one of or more of said normalized quiescent current values indicates the presence of an activated defect, discarding quiescent current values corresponding to said one or more normalized quiescent current values.

19. The workstation of claim 18, wherein said program instructions further comprise program instructions for repetitively executing said program instructions for computing and normalizing responsive to said program instructions for determining having determined that one of or more of said normalized quiescent current values indicates the presence of an activated defect.

20. The workstation of claim 14, wherein said workstation is coupled to a wafer test unit for providing said stimulus vectors and measuring said quiescent current values.

* * * * *